United States Statutory Invention Registration [19]

[11] Reg. Number: H371

Bobb

[43] Published: Nov. 3, 1987

[54] OPTICAL FIBER INTERFEROMETER

[75] Inventor: Lloyd C. Bobb, Warminster, Pa.

[73] Assignee: The United States of America as represented by the Secretary of the Navy, Washington, D.C.

[21] Appl. No.: 3,357

[22] Filed: Jan. 14, 1987

[51] Int. Cl.[4] ..... G01R 33/02; G01D 5/34

[52] U.S. Cl. ..... 324/244; 324/260; 324/96; 324/72; 250/231 R

[56] References Cited

U.S. PATENT DOCUMENTS

| | | |
|---|---|---|
| 3,308,394 | 3/1967 | Snitzer et al. . |
| 4,162,397 | 7/1979 | Bucaro et al. . |
| 4,319,186 | 3/1982 | Kingsley . |
| 4,329,058 | 5/1982 | James et al. . |
| 4,360,272 | 11/1982 | Schmadel et al. . |
| 4,368,981 | 1/1983 | Ozeki . |

*Primary Examiner*—Stephen C. Buczinski
*Assistant Examiner*—Linda J. Wallace
*Attorney, Agent, or Firm*—Henry Hansen

[57] ABSTRACT

A sensor system is disclosed for measuring small physical perturbations in the environment using an optical fiber interferometer in the Fabry-Perot configuration operating at maximum sensitivity. A single frequency laser source is focused on one end of a single mode optical fiber with highly polished, highly reflective flat ends. An element responsive to the ambient magnetic or electric field alters the fiber's optical path length, thereby affecting the intensity of light transmitted through the fiber. A detection and feedback system detects the transmitted light and readjusts the optical path length to one which corresponds to maximum sensitivity.

11 Claims, 4 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

OPTICAL FIBER INTERFEROMETER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to optical fiber interferometers and more particularly to an optical fiber interferometer in the Fabry-Perot configuration operating at its maximum sensitivity.

Optical fiber interferometers developed in recent years are generally either amplitude sensing or phase sensing. Because of their greater sensitivity, however, phase sensors, especially those which employ a Mach-Zehnder arrangement, have typically been preferred. In such an arrangement, shown for example in U.S. Pat. No. 4,524,322 to Lloyd C. Bobb, a laser beam is split, with one part of the beam being transmitted by a reference fiber and the other by a sensing fiber which is exposed to the environment or field of interest. The two beams are subsequently recombined and interfere on the surface of a photodetector. Suitable means is provided on the reference fiber for either shifting the optical frequency or modulating the phase in order to detect the original phase modulated signal. While such Mach-Zehnder type optical fiber interferometers provide greatly enhanced sensitivities, their relative complexity of design (i.e. the requirement for a reference fiber, beam splitters and combiners, etc.) results in a more costly, difficult-to-fabricate interferometer having an increased number of sources of noise due to the additional components required.

Single fiber interferometers have also been developed. Such an interferometer in the Fabry-Perot configuration is discussed in U.S. Pat. No. 4,536,088 to Rashleigh et al, and described in an article by S. J. Petuchowski et al (IEEE Journal of Quantum Electronics, Vol. QE-17, No. 11, November 1981, p. 2168) and in another article by Yoshino et al (IEEE Journal of Quantum Electronics, Vol. QE-18, No. 10, October 1982, p. 1624.) These interferometers overcome the complexity of design and fabrication problems of the Mach-Zehnder arrangement, but none of these references disclose using the already-available structure of the interferometer in a feedback system to operate the interferometer at its maximum sensitivity.

SUMMARY OF THE INVENTION

An object of the present invention is to provide an interferometer for measuring very small physical perturbations in the environment such as changes in magnetic field and electric field.

Other objects include providing an interferometer which is less costly, easier to fabricate, and more sensitive. Still another object is to maintain operation of an interferometer at its maximum sensitivity.

Briefly, these objects of the present invention are accomplished by an optical fiber interferometer in the Fabry-Perot configuration. Light from a single frequency laser source is focused onto one end of a single mode optical fiber with highly polished, highly reflective flat ends through which the light is transmitted. A detector situated at the other end of the fiber detects the intensity of the transmitted light. Fixed to the fiber is a sensor element which changes in response to an environmental physical perturbation to be measured. The change in the sensor element causes a change in either the length or the index of refraction of the fiber which changes the interference pattern produced at the other end. A feedback system then readjusts the fiber so that the system may operate at its maximum sensitivity.

Other objects, advantages and novel features of the invention will become apparent from the following detailed description of the invention when considered in conjunction with the accompanying drawings wherein:

DESCRIPTION OF THE PREFERRED EMBODIMENTS

Figure 1:
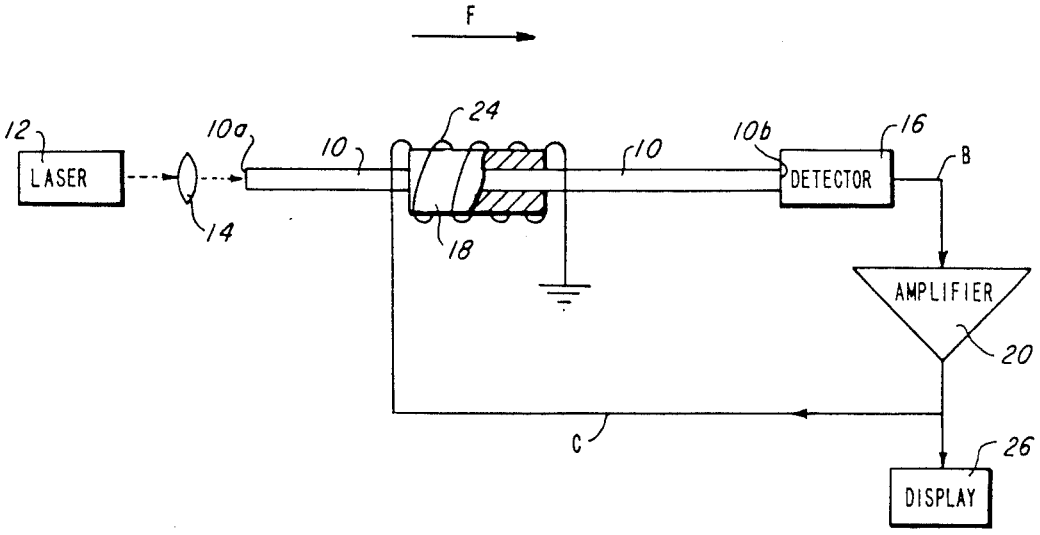
FIG. 1 is a schematic illustration of a preferred embodiment of an optical fiber interferometer for measuring a magnetic field according to the present invention.

Referring now to the drawings wherein like characters designate like or corresponding parts throughout the several views, there is shown in FIG. 1 an interferometer in a Fabry-Perot configuration for measuring magnetic field F. It includes a single mode optical fiber 10 with highly polished flat ends 10*a* and 10*b* perpendicular to the axis of fiber 10 at its respective ends. A single mode fiber will only propogate light along its axis. Ends 10*a* and 10*b* have a uniform dielectric coating of high reflectivity and low loss. Coherent light from a laser 12 is directed via a lens 14 into end 10*a*. A detector 16 abuts end 10*b*, detects the intensity of light transmitted through fiber 10, and produces an electrical signal B indicative thereof. The amount of transmitted light is a function of the length l of fiber 10, its index of refraction n, and its reflectivity at ends 10*a* and 10*b*. The transmitted light also varies with the optical path length (OPL) of the light in fiber 10 according to the following formula: $OPL=(2\pi nl/\lambda)$ where l = length of 10 n = index of refraction of fiber 10

$\lambda$ = wavelength of the transmitted light

Figure 2:
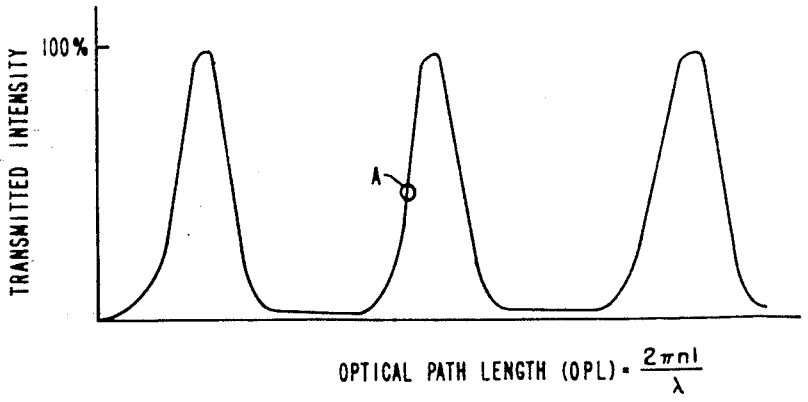
FIG. 2 is a typical graph of transmitted light intensity as a function of the optical path length as applied to the interferometer of FIG. 1.

FIG. 2 shows how the transmitted light intensity varies with OPL. It can be seen that anything that affects the OPL of the light in the fiber affects the intensity of transmitted light and is therefore detectable. Thus any change in length, index of refraction, or wavelength will manifest a change in the light intensity at end 10*b*.

If a physical perturbation in the environment is allowed to affect only one of the parameters, the extent of its effect can be measured as a change in light intensity at end 10*b*. In the interferometer of FIG. 1 the parameter affected is fiber length l. A magnetostrictive sensor element 18, such as nickel or iron, is contiguously fixed as by bonding a finite length to fiber 10. Element 18 changes length as a function of magnetic field strength, and thereby produces a corresponding change in the OPL of fiber 10. This affects the intensity of transmitted light as shown in FIG. 2. The intensity change is detected and the change in magnetic field strength thereby determined.

It is desirable to operate an interferometer at its point of maximum sensitivity to the environmental perturbation. For the magnetic field measurement, this would be at a point where a small change in magnetic field strength results in a large change in transmitted light intensity, for example at point A in FIG. 2. Therefore it is desirable to operate the interferometer with an OPL that corresponds to point A. The sensitivity of the device can be increased by making the slope at point A steeper such as by increasing the flatness and reflectivity of the ends 10*a* and 10*b*. Since fiber length l is the variable parameter for magnetic field measurement, the length l can be adjusted to keep the OPL at the point A. This is done with a feedback system which uses the signal B from detector 16 to determine the change in fiber length l, and restores the length to that which corresponds to maximum sensitivity. Feedback amplifier 20 receives signal B and applies an appropriate feedback current C to a magnetic coil 24 surrounding element 18. The magnetic field created by coil 24 restores the original length of sensor element 18 and thereby the length l of fiber 10. Display 26, connected to amplifier 20, measures and displays the feedback current C which is indicative of the strength of the magnetic field F.

Figure 3:
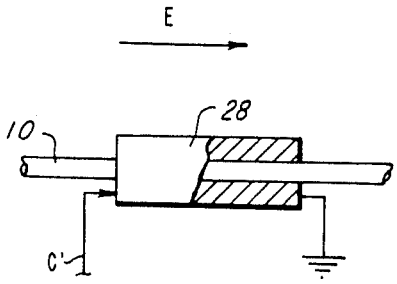
FIG. 3 is a schematic illustration of another embodiment of a sensor element for measuring an electric field according to the present invention.

Referring to FIG. 3, there is shown a piezoelectric sensor element 28, substituted for magnetostrictive sensor element 18, which changes length in response to an electric field E. The feedback current C′ is connected directly to element 28, and is indicative of the electric field strength change.

Figure 4:
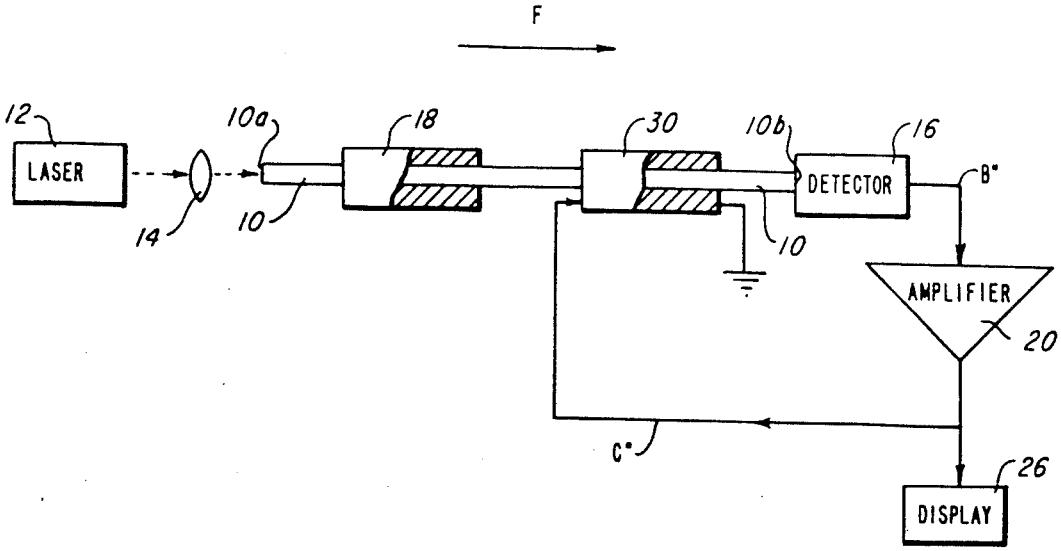
FIG. 4 is a schematic illustration of another embodiment of the interferometer for measuring a magnetic field according to the invention.

Alternatively, the present invention includes a separate length-restoring means. Referring to FIG. 4 the output C″ from feedback amplifier 20 connects to a piezoelectric restoring element 30. The fiber is restored to its original length in the same manner as in the magnetic field interferometer of FIG. 1. Either a magnetostrictive or a piezoelectric restoring element can be used with either a magnetostrictive or a piezoelectric sensor element.

It is apparent that the disclosed invention provides an improved optical fiber interferometer for measuring very small physical perturbations in the environment such as changes in magnetic field and electric field. It provides increased sensitivity and is less costly and easier to fabricate than existing interferometers. The disclosed invention also provides a method for operating the optical fiber interferometer at a point of maximum sensitivity.

Other embodiments and modifications of the present invention may readily come to those of ordinary skill in the art having the benefit of the teachings presented in the foregoing description and drawings.

Therefore, it is to be understood that the present invention is not to be limited to such teachings presented, and that such further embodiments and modifications are intended to be included within the scope of the appended claims.

What is claimed is:

1. An optical fiber interferometer for measuring environmental perturbations comprising:

a source of coherent light;

a length of optical fiber having two flat ends perpendicular to the axis of said fiber at said ends, said fiber being operatively connected to transmit the light received through one of said ends;

detecting means operatively connected to receive the transmitted light from the other of said ends for detecting the intensity of the received light and for producing a signal indicative thereof;

sensing means operatively connected to said fiber for modulating the optical path length of the light in said fiber in response to an environmental perturbation;

feedback means operatively connected to said detecting means for receiving the signal therefrom and producing a current at said sensing means for adjusting the optical path length in response to the signal; and display means operatively connected to said feedback means for measuring the current and displaying a value indicative of the corresponding perturbation.

2. An optical fiber interferometer according to claim 1 wherein said fiber is single mode.

3. An optical fiber interferometer according to claim 1 wherein said flat ends are partially reflective.

4. An optical fiber interferometer according to claim 1 wherein said sensing means comprises a magnetostrictive element responsive to changes in ambient magnetic field strength.

5. An optical fiber interferometer according to claim 4 wherein said feedback means comprises:

electronic means operatively connected to receive and amplify the signal; and a coil about said element operatively connected to receive the amplified signal and create a magnetic field adjacent to said magnetostrictive element.

6. An optical fiber interferometer according to claim 1 wherein said sensing means comprises a piezoelectric element responsive to changes in ambient electric field strength.

7. An optical fiber interferometer according to claim 6 wherein said feedback means comprises:

electronic means operatively connected for receiving the signal from said detecting means; and circuitry operatively connected to said electronic means for passing a current through said piezoelectric element.

8. An optical fiber interferometer for measuring change in magnetic field, comprising:

a source of coherent light;

a length of single mode optical fiber having two partially reflective flat ends, said fiber being optically connected to transmit the light received through one of said ends;

detecting means optically connected to receive the transmitted light from the other of said fiber ends for detecting the intensity of the received light and producing a signal indicative thereof;

a magnetostrictive element operatively connected to said fiber for changing the length of said fiber in response to a magnetic field, thereby altering the optical path length of said fiber and changing the interference condition and therefore the intensity of the light received by said detecting means;

feedback means operatively connected to said detecting means for receiving the signal therefrom and producing a current to said element for adjusting the length of said fiber in response to the signal; and display means operatively connected to said feedback means for receiving a portion of the current therefrom and displaying a value indicative of the corresponding magnetic field.

9. An optical fiber interferometer according to claim 8 wherein said feedback means comprises:

electronic means operatively connected to receive and amplify the signal; and a coil about said element operatively connected to receive the amplified signal and create a magnetic field adjacent to said magnetostrictive element.

10. An optical fiber interferometer for measuring change in electric field, comprising:

a source of coherent light;

a length of single mode optical fiber having two partially reflective flat ends, said fiber being optically connected to transmit the light received through one of said ends;

detecting means optically connected to receive the transmitted light from the other of said fiber ends for detecting the intensity of the received light and producing a signal indicative thereof;

a piezoelectric element operatively connected to said fiber for changing the length of said fiber in response to an electric field, thereby altering the optical path length of said fiber and changing the interference condition and therefore the intensity of the light received by said detecting means;

feedback means operatively connected to said detecting means for receiving the signal therefrom and producing a current to said element for adjusting the length of said fiber in response to the signal; and display means operatively connected to said feedback means for receiving a portion of the current therefrom and displaying a value indicative of the corresponding electric field.

11. An optical fiber interferometer according to claim 10 wherein said feedback means comprises:

electronic means operatively connected for receiving the signal from said detecting means; and circuitry operatively connected to said electronic means for passing a current through said piezoelectric element.

* * * * *